(12) United States Patent
Khlat

(10) Patent No.: US 12,199,570 B2
(45) Date of Patent: Jan. 14, 2025

(54) ENVELOPE TRACKING INTEGRATED CIRCUIT FOR REDUCING IN-RUSH BATTERY CURRENT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 451 days.

(21) Appl. No.: 17/523,985

(22) Filed: Nov. 11, 2021

(65) Prior Publication Data

US 2022/0360226 A1 Nov. 10, 2022

Related U.S. Application Data

(60) Provisional application No. 63/185,939, filed on May 7, 2021.

(51) Int. Cl.
*H03F 1/02* (2006.01)
*H03F 3/04* (2006.01)
*H03F 3/19* (2006.01)

(52) U.S. Cl.
CPC ............ *H03F 1/0216* (2013.01); *H03F 3/19* (2013.01); *H03F 2200/105* (2013.01); *H03F 2200/375* (2013.01); *H03F 2200/451* (2013.01)

(58) Field of Classification Search
CPC .... H03F 1/0216; H03F 3/19; H03F 2200/105; H03F 2200/375; H03F 2200/451; H03F 1/0227; H03F 2200/102; Y02D 30/70
USPC .................................................. 330/127, 297
See application file for complete search history.

(56) References Cited

U.S. PATENT DOCUMENTS

| 8,154,341 | B2 | 4/2012 | Ishikawa et al. |
| 11,349,436 | B2 | 5/2022 | Khlat |
| 11,973,469 | B2 | 4/2024 | Retz et al. |
| 2012/0163632 | A1 | 6/2012 | Lesso et al. |
| 2012/0170770 | A1 | 7/2012 | Lesso et al. |
| 2016/0164551 | A1 | 6/2016 | Khlat et al. |
| 2018/0241347 | A1 | 8/2018 | Petrovic et al. |

(Continued)

OTHER PUBLICATIONS

1 Notice of Allowance for U.S. Appl. No. 17/523,957, mailed Jan. 13, 2023, 9 pages.

(Continued)

*Primary Examiner* — Andrea Lindgren Baltzell
*Assistant Examiner* — Khiem D Nguyen
(74) *Attorney, Agent, or Firm* — Withrow & Terranova, P.L.L.C.

(57) ABSTRACT

An envelope tracking (ET) integrated circuit (ETIC) for reducing in-rush battery current is provided. The ETIC includes an ET voltage circuit configured to generate a time-variant ET voltage, which includes an offset voltage, in multiple time intervals based on a supply voltage. In some cases, the offset voltage and the supply voltage may both need to be increased or decreased as the time-variant ET voltage increases or decreases. As the offset voltage and the supply voltage increase or decrease, an excessive in-rush battery current may be generated in the ETIC to result in a reduced battery life. Hence, the ETIC is configured to avoid increasing or decreasing the offset voltage and the supply voltage in a same one of the time intervals. As a result, it is possible to reduce the in-rush battery current in the ETIC while still allowing the time-variant ET voltage to change in a timely manner.

20 Claims, 7 Drawing Sheets

(56) References Cited

U.S. PATENT DOCUMENTS

| | | |
|---|---|---|
| 2018/0331659 A1 | 11/2018 | Khesbak et al. |
| 2020/0304082 A1 | 9/2020 | Henzler et al. |
| 2021/0194517 A1* | 6/2021 | Mirea .................. H03F 3/24 |
| 2022/0286094 A1 | 9/2022 | Granger-Jones et al. |

OTHER PUBLICATIONS

Non-Final Office Action for U.S. Appl. No. 17/523,966, mailed Jun. 11, 2024, 6 pages.
Notice of Allowance for U.S. Appl. No. 17/507,173, mailed Apr. 10, 2024, 9 pages.
Non-Final Office Action for U.S. Appl. No. 17/523,999, mailed Aug. 29, 2024, 12 pages.
Notice of Allowance for U.S. Appl. No. 17/523,966, mailed Oct. 11, 2024, 7 pages.

* cited by examiner

ENVELOPE TRACKING INTEGRATED CIRCUIT FOR REDUCING IN-RUSH BATTERY CURRENT

RELATED APPLICATIONS

This application claims the benefit of U.S. provisional patent application Ser. No. 63/185,939 filed on May 7, 2021, the disclosure of which is incorporated herein by reference in its entirety.

FIELD OF THE DISCLOSURE

The technology of the disclosure relates generally to reducing in-rush battery current in an envelope tracking (ET) integrated circuit (ETIC).

BACKGROUND

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency.

Downlink and uplink transmissions in a 5G-NR system are widely based on orthogonal frequency division multiplexing (OFDM) technology. In an OFDM based system, physical radio resources are divided into a number of subcarriers in a frequency domain and a number of OFDM symbols in a time domain. The subcarriers are orthogonally separated from each other by a subcarrier spacing (SCS). The OFDM symbols are separated from each other by a cyclic prefix (CP), which acts as a guard band to help overcome inter-symbol interference (ISI) between the OFDM symbols.

A radio frequency (RF) signal communicated in the OFDM based system is often modulated into multiple subcarriers in the frequency domain and multiple OFDM symbols in the time domain. The multiple subcarriers occupied by the RF signal collectively define a modulation bandwidth of the RF signal. The multiple OFDM symbols, on the other hand, define multiple time intervals during which the RF signal is communicated. In the 5G-NR system, the RF signal is typically modulated with a high modulation bandwidth in excess of 200 MHz (e.g., 1 GHz).

The duration of an OFDM symbol depends on the SCS and the modulation bandwidth. The table below (Table 1) provides some OFDM symbol durations, as defined by 3G partnership project (3GPP) standard for various SCSs and modulation bandwidths. Notably, the higher the modulation bandwidth is, the shorter the OFDM symbol duration will be. For example, when the SCS is 120 KHz and the modulation bandwidth is 400 MHz, the OFDM symbol duration is 8.93 µs.

TABLE 1

| SCS (KHz) | CP (µs) | OFDM Symbol Duration (µs) | Modulation Bandwidth (MHz) |
|---|---|---|---|
| 15 | 4.69 | 71.43 | 50 |
| 30 | 2.34 | 35.71 | 100 |
| 60 | 1.17 | 17.86 | 200 |
| 120 | 0.59 | 8.93 | 400 |

Notably, the wireless communication device relies on a battery cell (e.g., Li-Ion battery) to power its operations and services. Despite recent advancement in battery technologies, the wireless communication device can run into a low battery situation from time to time. In this regard, it is desirable to prolong battery life concurrent to enabling fast voltage changes between the OFDM symbols.

SUMMARY

Embodiments of the disclosure relate to an envelope tracking (ET) integrated circuit (ETIC) for reducing in-rush battery current. The ETIC includes an ET voltage circuit configured to generate a time-variant ET voltage, which includes an offset voltage, in multiple time intervals based on a supply voltage. In some cases, the offset voltage and the supply voltage may both need to be increased or decreased as the time-variant ET voltage increases or decreases. As the offset voltage and the supply voltage increase or decrease, an excessive in-rush battery current may be generated in the ETIC to result in a reduced battery life. In this regard, in embodiments disclosed herein, the ETIC is configured to avoid increasing or decreasing the offset voltage and the supply voltage in a same one of the time intervals. As a result, it is possible to reduce the in-rush battery current in the ETIC while still allowing the time-variant ET voltage to change in a timely manner.

In one aspect, an ETIC is provided. The ETIC includes an ET voltage circuit. The ET voltage circuit is configured to generate a time-variant ET voltage comprising an offset voltage in multiple time intervals based on a supply voltage. In each of the multiple time intervals, the supply voltage is a function of a maximum level and a minimum level of the time-variant ET voltage and the offset voltage is a function of the minimum level of the time-variant ET voltage. The ETIC also includes a control circuit. The control circuit is configured to determine, in a first one of the multiple time intervals, that the supply voltage and the offset voltage are set to change in a same direction in a second one of the multiple time intervals immediately succeeding the first one of the multiple time intervals. The control circuit is also configured to cause one of the supply voltage and the offset voltage to change in the first one of the multiple time intervals. The control circuit is also configured to cause another one of the supply voltage and the offset voltage to change in the second one of the multiple time intervals.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
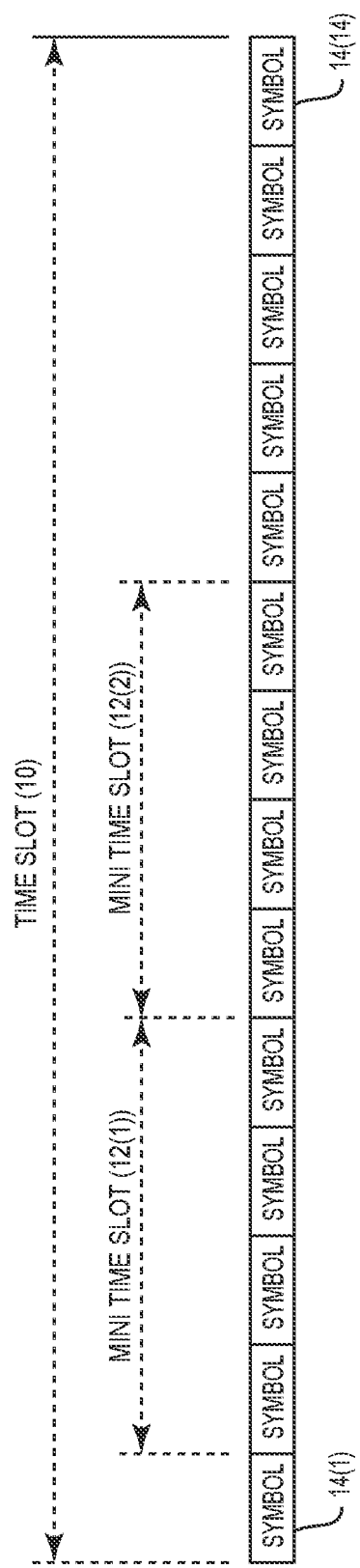
FIG. 1 illustrates an exemplary time slot(s) and a mini time slot(s) as widely supported in a fifth generation (5G) system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) integrated circuit (ETIC) for reducing in-rush battery current. The ETIC includes an ET voltage circuit configured to generate a time-variant ET voltage, which includes an offset voltage, in multiple time intervals based on a supply voltage. In some cases, the offset voltage and the supply voltage may both need to be increased or decreased as the time-variant ET voltage increases or decreases. As the offset voltage and the supply voltage increase or decrease, an excessive in-rush battery current may be generated in the ETIC to result in a reduced battery life. In this regard, in embodiments disclosed herein, the ETIC is configured to avoid increasing or decreasing the offset voltage and the supply voltage in a same one of the time intervals. As a result, it is possible to reduce the in-rush battery current in the ETIC while still allowing the time-variant ET voltage to change in a timely manner.

Figure 2:
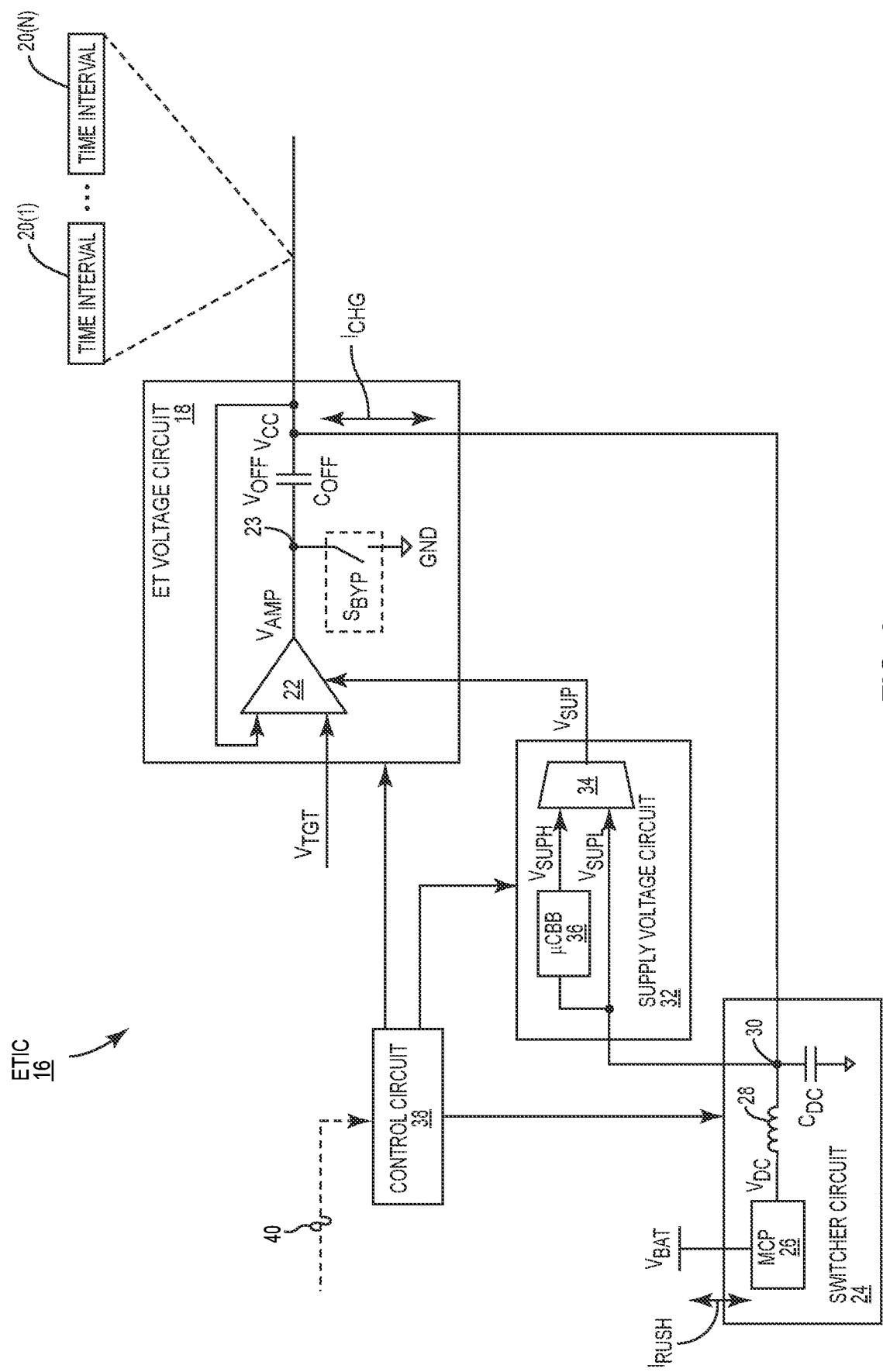
FIG. 2 is a schematic diagram of an exemplary envelope tracking (ET) integrated circuit (ETIC) configured according to embodiments of the present disclosure to reduce in-rush battery current.

Before discussing the ETIC for reducing in-rush battery current according to the present disclosure, starting at FIG. 2, an overview of a time slot and mini time slot, which can be used to define durations of the time intervals, is first provided with reference to FIG. 1.

FIG. 1 illustrates an exemplary time slot 10 and a pair of mini time slots 12(1)-12(2) as widely supported in a fifth generation (5G) system. The time slot(s) 10 is configured to include multiple orthogonal frequency division multiplexing (OFDM) symbols 14(1)-14(14). The mini time slots 12(1)-12(2) can each include at least two of the OFDM symbols 14(1)-14(14). In the example shown in FIG. 1, the mini time slots 12(1)-12(2) each include four of the OFDM symbols 14(1)-14(14).

As previously shown in Table 1, each of the OFDM symbols 14(1)-14(14) has a symbol duration that depends on the subcarrier spacing (SCS). In this regard, once the SCS is chosen, the duration of the time slot 10 and the mini time slots 12(1)-12(2) will be set accordingly. In a non-limiting example, the duration of the time slot 10 or the duration the mini time slots 12(1)-12(2) can be used to define the duration of a time interval, which will be frequently referenced in embodiments discussed next.

FIG. 2 is a schematic diagram of an exemplary ETIC 16 configured according to embodiments of the present disclosure to reduce an in-rush battery current $I_{RUSH}$. Herein, the in-rush battery current $I_{RUSH}$ refers to an instantaneous current associated with charging or discharging a capacitor(s) in the ETIC 16. The in-rush battery current $I_{RUSH}$ can be bidirectional, meaning that the in-rush battery current $I_{RUSH}$ can either flow from a battery (not shown) toward the capacitor(s) when the capacitor(s) is charged or flow from the capacitor(s) toward the battery when the capacitor(s) is discharged. No matter what direction the in-rush battery current $I_{RUSH}$ flows, the battery can suffer a significant energy loss as a result. Understandably, the in-rush battery current $I_{RUSH}$ can become excessive when multiple capacitors are simultaneously charged or simultaneously discharged.

As discussed in detail below, the ETIC 16 can reduce the in-rush battery current $I_{RUSH}$ resulting from simultaneous charging or simultaneous discharging multiple capacitors. Specifically, the ETIC 16 can be configured to charge multiple capacitors or discharge multiple capacitors at different times. As a result, it is possible to reduce the in-rush battery current in the ETIC 16 to help prolong the life of the battery.

The ETIC 16 includes an ET voltage circuit 18 configured to generate a time-variant ET voltage $V_{CC}$ in a number of time intervals 20(1)-20(N) based on a supply voltage $V_{SUP}$. In a non-limiting example, each of the time intervals 20(1)-20(N) can be equivalent to the time slot 10 or any of the mini time slots 20(1)-20(2) in FIG. 1. In this regard, the time intervals 20(1)-20(N) can each include two or more of the OFDM symbols 14(1)-14(14) in FIG. 1.

The ET voltage circuit 18 includes a voltage amplifier 22 coupled in series to an offset capacitor $C_{OFF}$. The voltage amplifier 22 is configured to generate an initial ET voltage $V_{AMP}$ based on the supply voltage $V_{SUP}$ and a target voltage $V_{TGT}$. The offset capacitor $C_{OFF}$ is configured to raise the initial ET voltage $V_{AMP}$ by an offset voltage $V_{OFF}$ to generate the time-variant ET voltage $V_{CC}$ ($V_{CC}=V_{AMP}+V_{OFF}$). In this regard, the time-variant ET voltage $V_{CC}$ can be said to include the initial ET voltage $V_{AMP}$ and the offset voltage $V_{OFF}$. In an embodiment, the offset voltage $V_{OFF}$ can be modulated in accordance with equation (Eq. 1) below.

$$V_{OFF}=V_{CC-MIN}-N_{HEAD} \qquad (\text{Eq. 1})$$

In the equation (Eq. 1) above, $V_{CC-MIN}$ represents a minimum level of the time-variant ET voltage $V_{CC}$ in any of the time intervals 20(1)-20(N) and $N_{HEAD}$ represents a bottom headroom voltage. Given that $N_{HEAD}$ is typically fixed, the offset voltage $V_{OFF}$ will fluctuate in accordance with the $V_{CC-MIN}$. As such, the offset capacitor $C_{OFF}$ needs to be charged when the $V_{CC-MIN}$ increases and discharged when the $V_{CC-MIN}$ decreases.

The ET voltage circuit 18 can include a bypass switch $S_{BYP}$. The bypass switch $S_{BYP}$ is coupled between a middle node 23, which is located between the voltage amplifier 22 and the offset capacitor $C_{OFF}$, and a ground (GND). As discussed below, the bypass switch $S_{BYP}$ is closed to allow the offset capacitor $C_{OFF}$ to be charged and opened to allow the offset capacitor $C_{OFF}$ to be discharged.

The ETIC 16 also includes a switcher circuit 24 that is configured to modulate the offset voltage $V_{OFF}$. In a non-limiting example, the switcher circuit 24 includes a multi-level charge pump (MCP) 26, a power inductor 28, and a capacitor CDC. The MCP 26 is configured to generate a low-frequency voltage $V_{DC}$ as a function of a battery voltage $V_{BAT}$. More specifically, the MCP 26 can be configured to toggle the low-frequency voltage $V_{DC}$ between $0 \times V_{BAT}$ (0 V), $1 \times V_{BAT}$, or $2 \times V_{BAT}$ in accordance with a duty cycle. For example, if the battery voltage $V_{BAT}$ equals 5 V and the duty cycle is determined to be 30%@$0 \times V_{BAT}$, 30%@$1 \times V_{BAT}$, and 40%@$2 \times V_{BAT}$, then the MCP 26 would generate the low-frequency voltage $V_{DC}$ at 5.5 V (0.3*5 V+0.4*10 V=5.5 V). As such, the MCP 26 can be configured to generate the low-frequency voltage $V_{DC}$ at different levels in accordance with different duty cycles.

The power inductor 28 is coupled between the MCP 26 and a reference node 30. The capacitor CDC is coupled between the reference node 30 and the GND. The power inductor 28 and the capacitor CDC collectively form an inductor-capacitor (LC) network that outputs an average of the low-frequency voltage $V_{DC}$ at the reference node 30.

The power inductor 28 is configured to induce a charge current $I_{CHG}$ based on the low-frequency voltage $V_{DC}$. When the $V_{CC-MIN}$ increases and the bypass switch $C_{BYP}$ is closed, the charge current $I_{CHG}$ flows from the power inductor 28 toward the offset capacitor $C_{OFF}$ to cause the offset capacitor $C_{OFF}$ to be charged. When the $V_{CC-MIN}$ decreases and the bypass switch $C_{BYP}$ is opened, the charge current $I_{CHG}$ flows from the offset capacitor $C_{OFF}$ toward the power inductor 28 to cause the offset capacitor $C_{OFF}$ to be discharged. In this regard, the charge current $I_{CHG}$ can cause the offset voltage $V_{OFF}$ to be modulated in accordance with the equation (Eq. 1). Understandably, since the charge current $I_{CHG}$ can cause the offset capacitor $C_{OFF}$ to be charged or discharged, the offset capacitor $C_{OFF}$ can cause the overall in-rush battery current $I_{RUSH}$ to increase in the ETIC 16.

The ETIC 16 also includes a supply voltage circuit 32 configured to provide the supply voltage $V_{SUP}$ to the voltage amplifier 22. In a non-limiting example, the supply voltage circuit 32 is configured to concurrently generate a high supply voltage $V_{SUPH}$ and a low supply voltage $V_{SUPL}$. However, only one of the high supply voltage $V_{SUPH}$ and the low supply voltage $V_{SUPL}$ will be outputted by an output circuit 34 as the supply voltage $V_{SUP}$ at any given time. In an embodiment, the high supply voltage $V_{SUPH}$ and the low supply voltage $V_{SUPL}$ are generated in accordance with the equations (Eq. 2 and Eq. 3) below.

$$V_{SUPH}=V_{CC-MAX}-V_{CC-MIN}+N_{HEAD}+P_{HEAD} \qquad (\text{Eq. 2})$$

$$V_{SUPL}=V_{SUPH}/\mu\text{Ratio} \qquad (\text{Eq. 3})$$

In the equations above, $V_{CC-MAX}$ represents a maximum level of the time-variant ET voltage $V_{CC}$ in any of the time intervals 20(1)-20(N), $P_{HEAD}$ represents an upper headroom voltage, and µRatio represents a conversion ratio that is greater than 1 (µRatio>1). Given that $N_{HEAD}$, $P_{HEAD}$, and µRatio are typically fixed, the high supply voltage $V_{SUPH}$ and the low supply voltage $V_{SUPL}$ will fluctuate in accordance with the $V_{CC-MAX}$ and/or the $V_{CC-MIN}$.

In an embodiment, the supply voltage circuit 32 also includes a micro capacitor-based buck-boost circuit 36 (denoted as "µCBB"). The micro capacitor-based buck-boost circuit 36 is coupled between the reference node 30 and the output circuit 34 and is configured to generate the high supply voltage $V_{SUPH}$ by multiplying the low-frequency voltage $V_{DC}$ by the conversion ratio µRatio. The low supply voltage $V_{SUPL}$, on the other hand, is generated based on the equation (Eq. 3) above. For a detailed description of the supply voltage circuit 32, please refer to U.S. patent application Ser. No. 17/523,957, entitled "SUPPLY VOLTAGE CIRCUIT FOR REDUCING IN-RUSH BATTERY CURRENT IN AN ENVELOPE TRACKING INTEGRATED CIRCUIT."

The supply voltage circuit 32 may include a decoupling capacitor (not shown) to help provide isolation between the supply voltage circuit 32 and the power inductor 28. For example, the decoupling capacitor can be coupled between an output of the micro capacitor-based buck-boost circuit 36 and the GND. Understandably, the decoupling capacitor may also contribute to the overall in-rush battery current $I_{RUSH}$ in the ETIC 16. Thus, to help reduce the overall in-rush battery current $I_{RUSH}$ caused by charging and discharging of the offset capacitor $C_{OFF}$ and the decoupling capacitor, the ETIC 16 is configured to avoid increasing or decreasing both the offset voltage $V_{OFF}$ and the supply voltage $V_{SUP}$ at the same time.

In this regard, the ETIC 16 is further configured to include a control circuit 38, which can be a field-programmable gate array (FPGA) as an example. The control circuit 38 is coupled to and configured to control the ET voltage circuit 18, the switcher circuit 24, and the supply voltage circuit 32. In an embodiment, the control circuit 38 is configured to determine, in a first one of the time intervals 20(1)-20(N), that the supply voltage $V_{SUP}$ and the offset voltage $V_{OFF}$ are set to change in a same direction in a second one of the time intervals 20(1)-20(N) immediately succeeding the first one of the time intervals 20(1)-20(N).

Herein, the supply voltage $V_{SUP}$ and the offset voltage $V_{OFF}$ are said to change in the same direction when both the supply voltage $V_{SUP}$ and the offset voltage $V_{OFF}$ are set to increase at the same time or to decrease at the same time. In contrast, if one of the supply voltage $V_{SUP}$ and the offset voltage $V_{OFF}$ is set to increase and another one of the supply voltage $V_{SUP}$ and the offset voltage $V_{OFF}$ is set to decrease at the same time, the supply voltage $V_{SUP}$ and the offset voltage $V_{OFF}$ are said to change in a different direction.

In response to determining that the supply voltage $V_{SUP}$ and the offset voltage $V_{OFF}$ are set to increase in the same direction in the second one of the time intervals 20(1)-20(N), the control circuit 38 is configured to cause one of the supply voltage $V_{SUP}$ and the offset voltage $V_{OFF}$ to change in the first one of the time intervals 20(1)-20(N), and cause another one of the supply voltage $V_{SUP}$ and the offset voltage $V_{OFF}$ to change in the second one of the time intervals 20(1)-20(N). By making the supply voltage $V_{SUP}$ and the offset voltage $V_{OFF}$ change in different ones of the time intervals 20(1)-20(N), it is thus possible to reduce the overall in-rush battery current $I_{RUSH}$ in each of the time intervals 20(1)-20(N).

The control circuit 38 may determine whether the supply voltage $V_{SUP}$ and the offset voltage $V_{OFF}$ are set to change in a same direction or in a different direction in any of the time intervals 20(1)-20(N) based on an indication signal 40, which can be provided by a transceiver circuit (not shown), as an example. In a non-limiting example, the indication signal 40 can also help the control circuit 38 to determine how the time-variant ET voltage $V_{CC}$ will change, and accordingly how the initial ET voltage $V_{AMP}$, the offset voltage $V_{OFF}$, and the supply voltage $V_{SUP}$, will change in each of the time intervals 20(1)-20(N).

Figure 3:
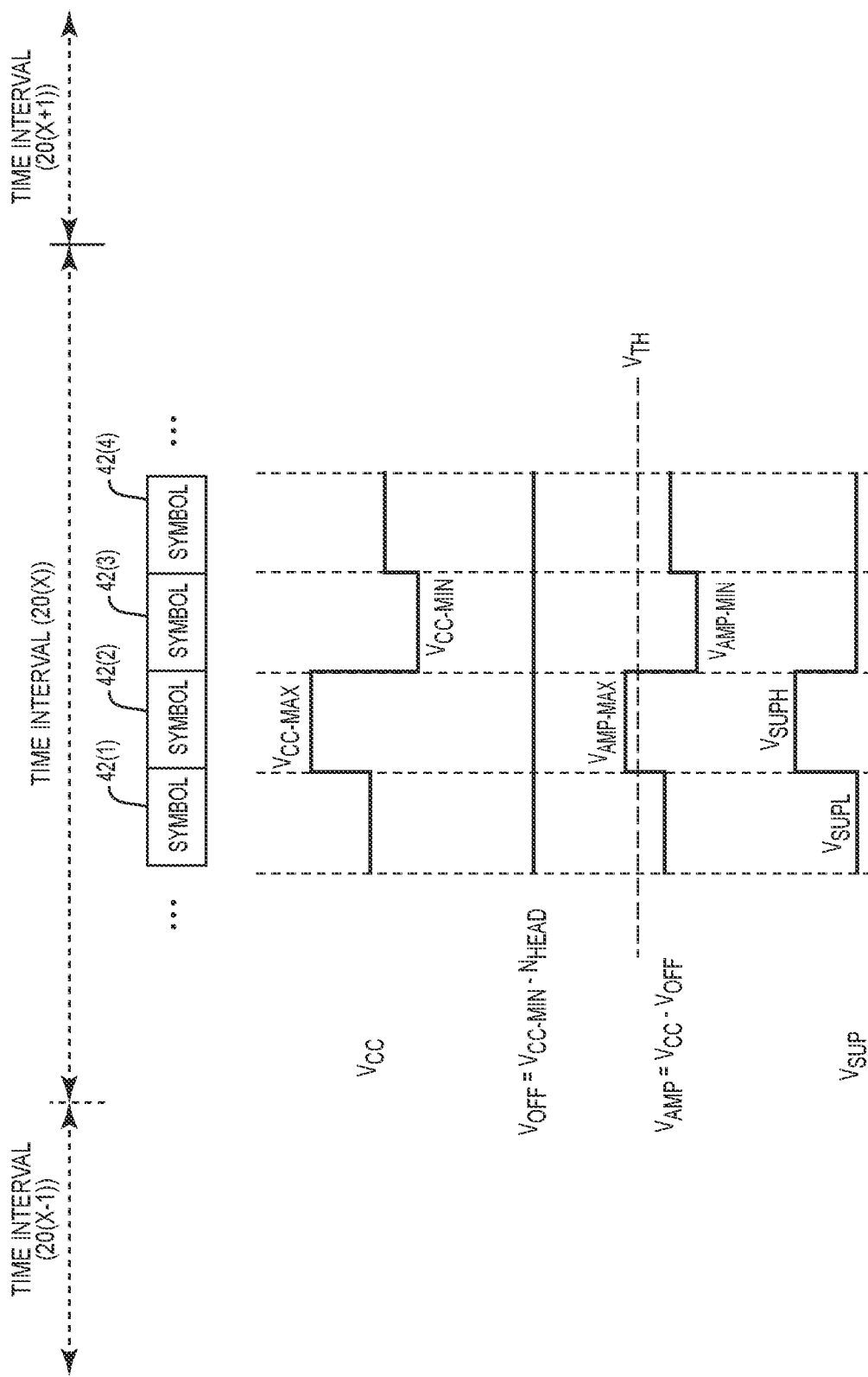
FIG. 3 is a diagram providing an exemplary illustration as to how to determine various voltage changes to help reduce the in-rush battery current in the ETIC of FIG. 2.

In this regard, FIG. 3 is a diagram providing an exemplary illustration as to how the control circuit 38 can determine various voltage changes in any of the time intervals 20(1)-20(N) to help reduce the overall in-rush battery current $I_{RUSH}$ in the ETIC 16 of FIG. 2. Notably, the time interval 20(X) illustrated in FIG. 3 can represent any of the time intervals 20(1)-20(N). The time interval 20(X) is also shown to include multiple consecutive symbols 42(1)-42(4), which can be among the OFDM symbols 14(1)-14(14) in FIG. 1. The time interval 20(X) is preceded by an immediately preceding time interval 20(X−1) and succeeded by an immediately succeeding time interval 20(X+1).

As shown in FIG. 3, the control circuit 38 can determine a maximum level ($V_{CC-MAX}$) and a minimum level ($V_{CC-MIN}$) of the time-variant ET voltage $V_{CC}$ during the time interval 20(X). Accordingly, the control circuit 38 can determine the offset voltage $V_{OFF}$ based on the equation (Eq. 1). Thus, by comparing the determined offset voltage $V_{OFF}$ against a respective offset voltage $V_{OFF}$ set in the immediately preceding time interval 20(X−1), the control circuit 38 can determine whether the offset voltage $V_{OFF}$ needs to be increased or decreased. In addition, the control circuit 38 may also learn (e.g., via the indication signal 40) about a root-to-mean square (RMS) power level in the time interval 20(X). Accordingly, the control circuit 38 can determine an average current level required to charge or discharge the offset capacitor $C_{OFF}$ to the determined offset voltage $V_{OFF}$ in the time interval 20(X).

Further, the control circuit 38 can determine a maximum initial ET voltage $V_{AMP-MAX}$ based on the maximum level ($V_{CC-MAX}$) of the time-variant ET voltage and the determined offset voltage $V_{OFF}$ ($V_{AMP-MAX}=V_{CC-MAX}-V_{OFF}$). Likewise, the control circuit 38 can determine a minimum initial ET voltage $V_{AMP-MIN}$ based on the minimum level ($V_{CC-MIN}$) of the time-variant ET voltage and the determined offset voltage $V_{OFF}$ ($V_{AMP-MIN}=V_{CC-MIN}-V_{OFF}$).

The control circuit 38 can compare the maximum initial ET voltage $V_{AMP-MAX}$, or alternative an average of the initial ET voltage $V_{AMP}$, during the time interval 20(X) against a threshold voltage $V_{TH}$ to determine whether the supply voltage $V_{SUP}$ should be increased or decreased. In addition, the control circuit 38 needs to determine whether the initial ET voltage $V_{AMP}$ in the immediately preceding time interval 20(X−1) is above or below the threshold voltage $V_{TH}$. If the initial ET voltage $V_{AMP}$ in the immediately preceding time interval 20(X−1) is lower than the threshold voltage $V_{TH}$ and the initial ET voltage $V_{AMP}$ in the time interval 20(X) is higher than or equal to the threshold voltage $V_{TH}$, the control circuit 38 can thus conclude that the supply voltage $V_{SUP}$ is set to increase in the time interval 20(X). In contrast, if the initial ET voltage $V_{AMP}$ in the immediately preceding time interval 20(X−1) is higher than or equal to the threshold voltage $V_{TH}$ and the initial ET voltage $V_{AMP}$ in the time interval 20(X) is lower than the threshold voltage $V_{TH}$, the control circuit 38 can thus conclude that the supply voltage $V_{SUP}$ is set to decrease in the time interval 20(X).

In an embodiment, the control circuit 38 can control the supply voltage circuit 32 to provide the high supply voltage $V_{SUPH}$ to the voltage amplifier 22 in response to determining that the supply voltage $V_{SUP}$ is set to increase in the time interval 20(X). In contrast, the control circuit 38 can control the supply voltage circuit 32 to provide the low supply voltage $V_{SUPL}$ to the voltage amplifier 22 in response to determining that the supply voltage $V_{SUP}$ is set to decrease in the time interval 20(X). The control circuit 38 can also determine the high supply voltage $V_{SUPH}$ and the low supply voltage $V_{SUPL}$ based on the equations (Eq. 2 and Eq. 3).

It should be appreciated that the control circuit 38 can also determine, in the time interval 20(X), the maximum level ($V_{CC-MAX}$) and minimum level ($V_{CC-MIN}$) of the time-variant ET voltage $V_{CC}$, the offset voltage $V_{OFF}$, the maximum initial ET voltage $V_{AMP-MAX}$, the minimum initial ET voltage $V_{AMP-MIN}$, the high supply voltage $V_{SUPH}$, and the low supply voltage $V_{SUPL}$ in the immediately succeeding time interval 20(X+1) based on the same steps as described above.

After determining, in the time interval 20(X) (a.k.a. "first one of the time intervals 20(1)-20(N)"), how the offset voltage $V_{OFF}$ and the supply voltage $V_{SUP}$ are set to change in the immediately succeeding time interval 20(X+1) (a.k.a. "second one of the time intervals 20(1)-20(N)"), the control circuit 38 may cause the offset voltage $V_{OFF}$ and the supply voltage $V_{SUP}$ to change in the immediately succeeding time interval 20(X+1) according to embodiments illustrated in FIGS. 4A-4D. In this regard, FIGS. 4A-4D provide exemplary illustrations of various embodiments of the present disclosure for reducing the in-rush battery current $I_{RUSH}$ in the ETIC 16 of FIG. 2.

Figure 4A:
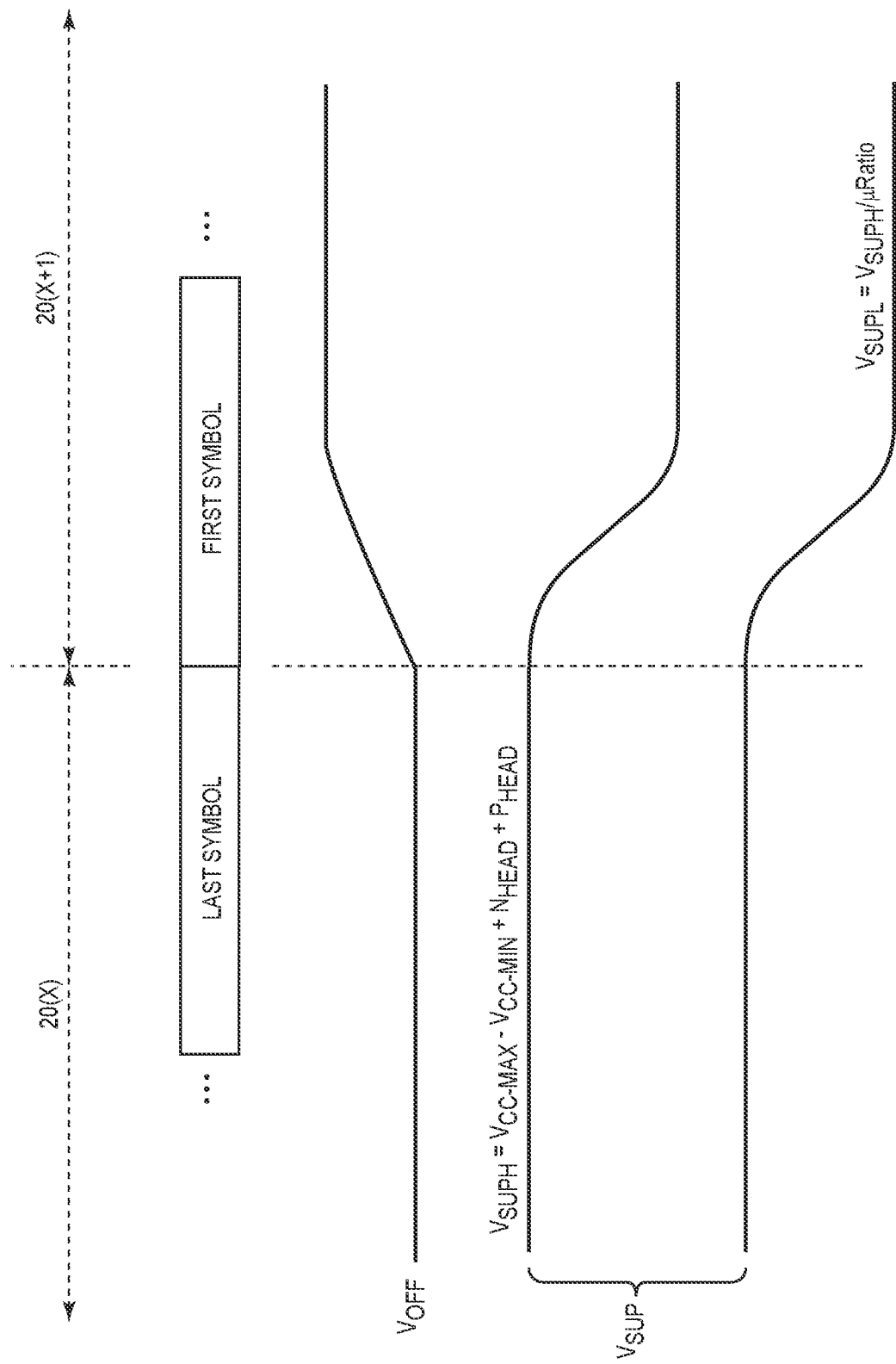
FIGS. 4A-4D provide exemplary illustrations of various embodiments of the present disclosure for reducing the in-rush battery current in the ETIC of FIG. 2.

With reference to FIG. 4A, in the time interval 20(X), the control circuit 38 determines that the offset voltage $V_{OFF}$ is set to increase and the supply voltage $V_{SUP}$ is set to decrease in the time interval $20(X+1)$. In this regard, the offset voltage $V_{OFF}$ and the supply voltage $V_{SUP}$ are set to change in a different direction, which may have less impact in the overall in-rush battery current $I_{RUSH}$ in the ETIC 16. Accordingly, the control circuit 38 may cause the offset voltage $V_{OFF}$ and the supply voltage $V_{SUP}$ to both change in the time interval $20(X+1)$. As illustrated in FIG. 4A, changing the supply voltage $V_{SUP}$ includes changing the high supply voltage $V_{SUPH}$ and the low supply voltage $V_{SUPL}$ concurrently in accordance with the equations (Eq. 2 and Eq. 3), respectively. In a non-limiting example, the control circuit 38 can cause the offset voltage $V_{OFF}$ and the supply voltage $V_{SUP}$ to both change in a first symbol of the time interval $20(X+1)$.

Figure 4B:
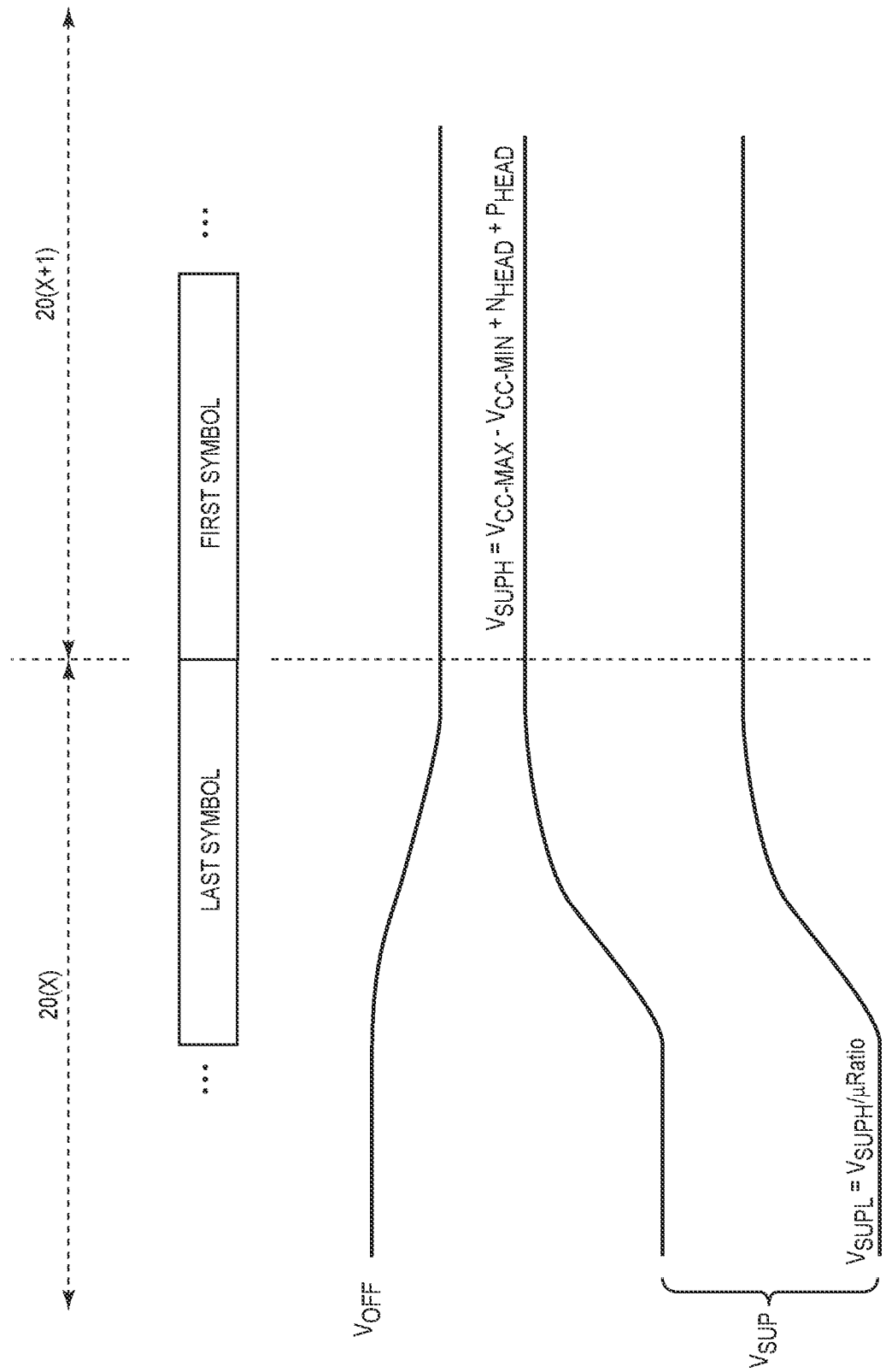

With reference to FIG. 4B, in the time interval $20(X)$, the control circuit 38 determines that the offset voltage $V_{OFF}$ is set to decrease and the supply voltage $V_{SUP}$ is set to increase in the time interval $20(X+1)$. In this regard, the offset voltage $V_{OFF}$ and the supply voltage $V_{SUP}$ are set to change in a different direction, which may have less impact in the overall in-rush battery current $I_{RUSH}$ in the ETIC 16. Accordingly, the control circuit 38 may cause the offset voltage $V_{OFF}$ and the supply voltage $V_{SUP}$ to both change in the time interval $20(X)$. As illustrated in FIG. 4B, changing the supply voltage $V_{SUP}$ includes changing the high supply voltage $V_{SUPH}$ and the low supply voltage $V_{SUPL}$ concurrently in accordance with the equations (Eq. 2 and Eq. 3), respectively. In a non-limiting example, the control circuit 38 can cause the offset voltage $V_{OFF}$ and the supply voltage $V_{SUP}$ to both change in a last symbol of the time interval $20(X)$.

Figure 4C:
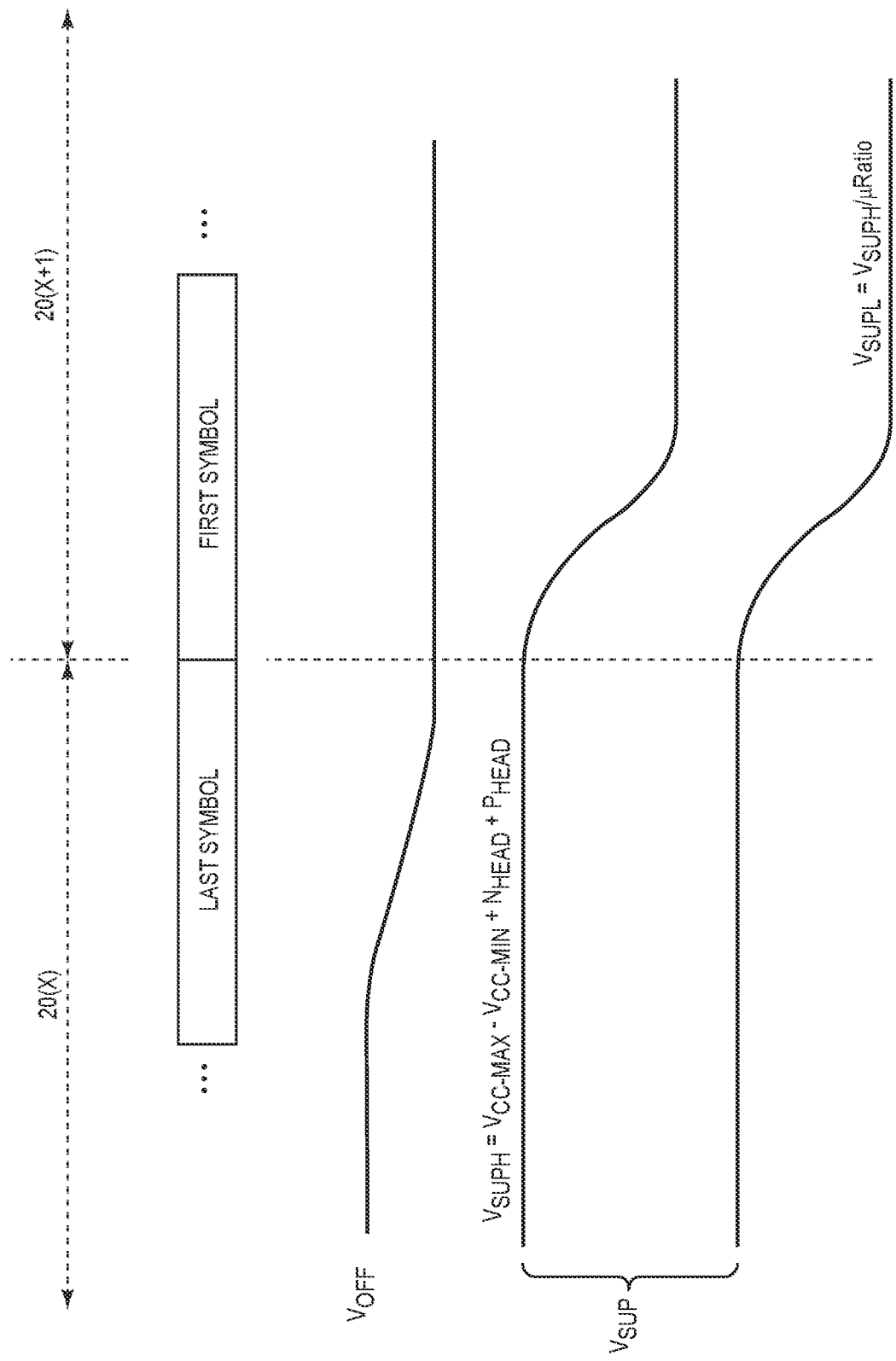

With reference to FIG. 4C, in the time interval $20(X)$, the control circuit 38 determines that the offset voltage $V_{OFF}$ and the supply voltage $V_{SUP}$ are both set to decrease in the time interval $20(X+1)$. In this regard, the offset voltage $V_{OFF}$ and the supply voltage $V_{SUP}$ are set to change in the same direction, which may have more impact in the overall in-rush battery current $I_{RUSH}$ in the ETIC 16. Accordingly, the control circuit 38 may cause the offset voltage $V_{OFF}$ to decrease in the time interval $20(X)$ and cause the supply voltage $V_{SUP}$ to decrease in the time interval $20(X+1)$. As illustrated in FIG. 4C, changing the supply voltage $V_{SUP}$ includes changing the high supply voltage $V_{SUPH}$ and the low supply voltage $V_{SUPL}$ concurrently in accordance with the equations (Eq. 2 and Eq. 3), respectively. In a non-limiting example, the control circuit 38 can cause the offset voltage $V_{OFF}$ to decrease in a last symbol in the time interval $20(X)$ and cause the supply voltage $V_{SUP}$ to decrease in a first symbol of the time interval $20(X+1)$.

Figure 4D:
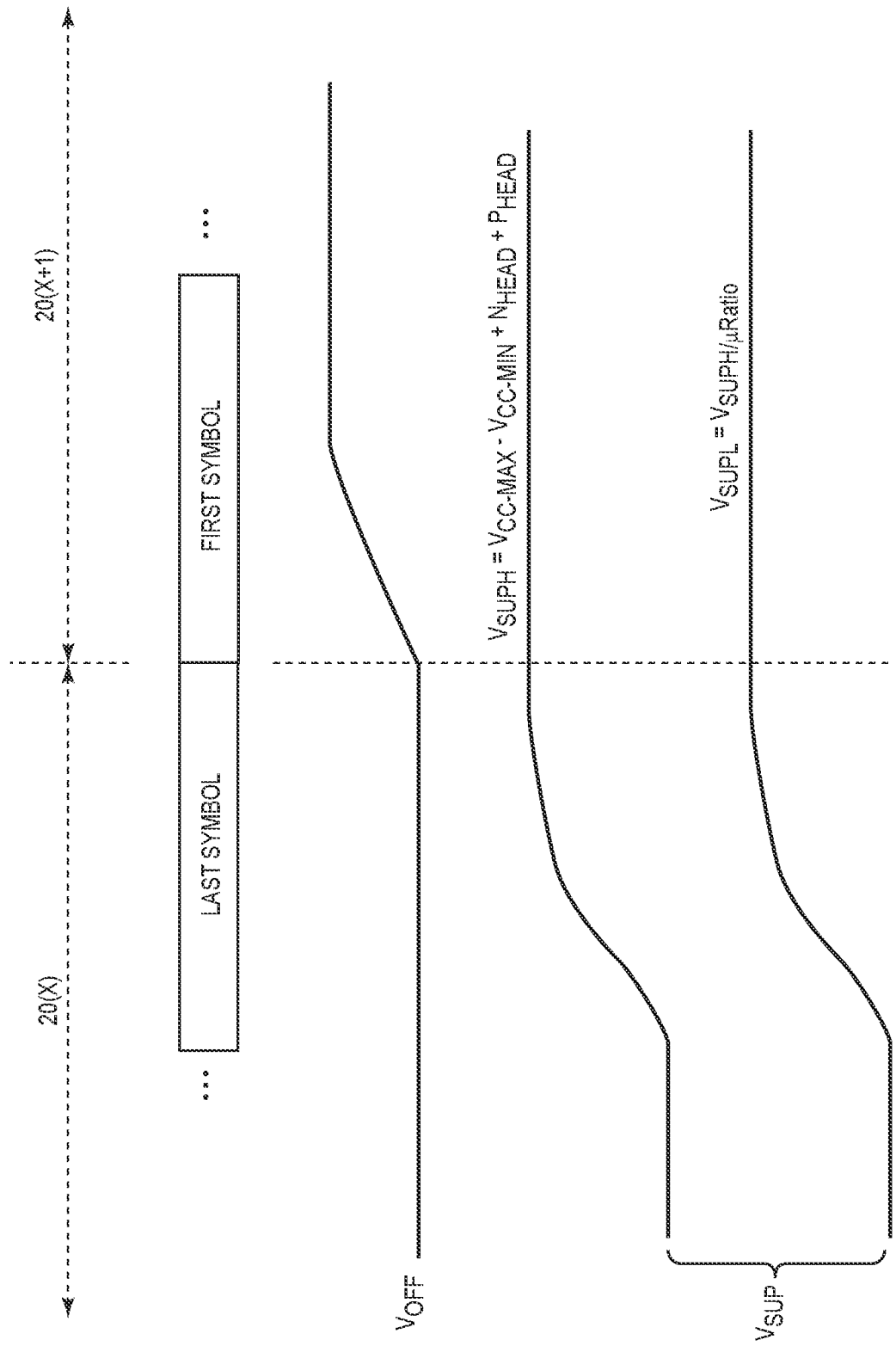

With reference to FIG. 4D, in the time interval $20(X)$, the control circuit 38 determines that the offset voltage $V_{OFF}$ and the supply voltage $V_{SUP}$ are both set to increase in the time interval $20(X+1)$. In this regard, the offset voltage $V_{OFF}$ and the supply voltage $V_{SUP}$ are set to change in the same direction, which may have more impact in the overall in-rush battery current $I_{RUSH}$ in the ETIC 16. Accordingly, the control circuit 38 may cause the supply voltage $V_{SUP}$ to increase in the time interval $20(X)$ and cause the offset voltage $V_{OFF}$ to increase in the time interval $20(X+1)$. As illustrated in FIG. 4D, changing the supply voltage $V_{SUP}$ includes changing the high supply voltage $V_{SUPH}$ and the low supply voltage $V_{SUPL}$ concurrently in accordance with the equations (Eq. 2 and Eq. 3), respectively. In a non-limiting example, the control circuit 38 can cause the supply voltage $V_{SUP}$ to increase in a last symbol in the time interval $20(X)$ and cause the offset voltage $V_{OFF}$ to increase in a first symbol of the time interval $20(X+1)$.

The principles for reducing the in-rush battery current $I_{RUSH}$ as illustrated in FIGS. 4A-4D can be summarized as follows:

1. If the offset voltage $V_{OFF}$ in the time interval $20(X+1)$ is higher than the offset voltage $V_{OFF}$ in the time interval $20(X)$, then the offset voltage $V_{OFF}$ will change in the first symbol of the time interval $20(X+1)$.
2. If the offset voltage $V_{OFF}$ in the time interval $20(X+1)$ is lower than the offset voltage $V_{OFF}$ in the time interval $20(X)$, then the offset voltage $V_{OFF}$ will change in the last symbol of the time interval $20(X)$.
3. If the supply voltage $V_{SUP}$ in the time interval $20(X+1)$ is higher than the supply voltage $V_{SUP}$ in the time interval $20(X)$, then the supply voltage $V_{SUP}$ will change in the last symbol of the time interval $20(X)$.
4. If the supply voltage $V_{SUP}$ in the time interval $20(X+1)$ is lower than the supply voltage $V_{SUP}$ in the time interval $20(X)$, then the supply voltage $V_{SUP}$ will change in the first symbol of the time interval $20(X+1)$.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (ETIC) comprising:
    an ET voltage circuit configured to generate a time-variant ET voltage comprising an offset voltage in a plurality of time intervals based on a supply voltage, wherein in each of the plurality of time intervals:
        the supply voltage is a function of a maximum level and a minimum level of the time-variant ET voltage; and
        the offset voltage is a function of the minimum level of the time-variant ET voltage; and
    a control circuit configured to:
        determine, in a first one of the plurality of time intervals, that the supply voltage and the offset voltage are set to change in a same direction in a second one of the plurality of time intervals immediately succeeding the first one of the plurality of time intervals;
        cause one of the supply voltage and the offset voltage to change in the first one of the plurality of time intervals; and
        cause another one of the supply voltage and the offset voltage to change in the second one of the plurality of time intervals.

2. The ETIC of claim 1, wherein the plurality of time intervals each comprises a plurality of symbols.

3. The ETIC of claim 2, wherein the control circuit is further configured to:
    determine, in the first one of the plurality of time intervals, that the supply voltage and the offset voltage are both set to decrease in the second one of the plurality of time intervals;
    cause the offset voltage to decrease in a last one of the plurality of symbols comprised in the first one of the plurality of time intervals; and
    cause the supply voltage to decrease in a first one of the plurality of symbols comprised in the second one of the plurality of time intervals.

4. The ETIC of claim 2, wherein the control circuit is further configured to:
- determine, in the first one of the plurality of time intervals, that the supply voltage and the offset voltage are both set to increase in the second one of the plurality of time intervals;
- cause the offset voltage to increase in a first one of the plurality of symbols comprised in the second one of the plurality of time intervals; and
- cause the supply voltage to increase in a last one of the plurality of symbols comprised in the first one of the plurality of time intervals.

5. The ETIC of claim 2, wherein the control circuit is further configured to:
- determine, in the first one of the plurality of time intervals, that the supply voltage and the offset voltage are set to change in a different direction in the second one of the plurality of time intervals; and
- cause one of the supply voltage and the offset voltage to concurrently change in any one of the first one of the plurality of time intervals and the second one of the plurality of time intervals.

6. The ETIC of claim 5, wherein the control circuit is further configured to:
- determine, in the first one of the plurality of time intervals, that the supply voltage is set to decrease and the offset voltage is set to increase in the second one of the plurality of time intervals; and
- cause the supply voltage to decrease and the offset voltage to increase concurrently in a first one of the plurality of symbols comprised in the second one of the plurality of time intervals.

7. The ETIC of claim 5, wherein the control circuit is further configured to:
- determine, in the first one of the plurality of time intervals, that the supply voltage is set to increase and the offset voltage is set to decrease in the second one of the plurality of time intervals; and
- cause the supply voltage to increase and the offset voltage to decrease concurrently in a last one of the plurality of symbols comprised in the first one of the plurality of time intervals.

8. The ETIC of claim 1, wherein the ET voltage circuit comprises:
- a voltage amplifier configured to generate an initial ET voltage based on the supply voltage; and
- an offset capacitor configured to raise the initial ET voltage by the offset voltage to generate the time-variant ET voltage.

9. The ETIC of claim 8, further comprising:
- a supply voltage circuit coupled to the voltage amplifier and configured to:
  - generate concurrently a high supply voltage and a low supply voltage lower than the high supply voltage in each of the plurality of time intervals; and
  - provide one of the high supply voltage and the low supply voltage to the voltage amplifier as the supply voltage in each of the plurality of time intervals; and
- a switcher circuit coupled to the offset capacitor and configured to generate a charging current to thereby modulate the offset voltage in each of the plurality of time intervals.

10. The ETIC of claim 9, wherein the supply voltage circuit is further configured to:
- generate the high supply voltage expressed as: $V_{SUPH}=V_{CC-MAX}-V_{CC-MIN}+N_{HEAD}+P_{HEAD}$, wherein:
  - $V_{SUPH}$ represents the high supply voltage;
  - $V_{CC-MAX}$ represents the maximum level of the time-variant ET voltage;
  - $V_{CC-MIN}$ represents the minimum level of the time-variant ET voltage;
  - $N_{HEAD}$ represents a bottom headroom voltage; and
  - $P_{HEAD}$ represents an upper headroom voltage; and
- generate the low supply voltage expressed as: $V_{SUPL}=V_{SUPH}/\mu Ratio$, wherein:
  - $V_{SUPL}$ represents the low supply voltage; and
  - μRatio represents a conversion ratio that is greater than one.

11. The ETIC of claim 9, wherein the offset voltage is modulated to equal $V_{CC-MIN}-N_{HEAD}$, wherein:
- $V_{CC-MIN}$ represents the minimum level of the time-variant ET voltage in each of the plurality of time intervals; and
- $N_{HEAD}$ represents a bottom headroom voltage.

12. The ETIC of claim 9, wherein the switcher circuit comprises:
- a multi-level charge pump (MCP) configured to generate a low-frequency voltage as a function of a battery voltage and in accordance with a duty cycle; and
- a power inductor coupled to the offset capacitor and configured to induce the charging current based on the low-frequency voltage.

13. The ETIC of claim 9, wherein the control circuit is further configured to:
- determine that the offset voltage is set to increase in the second one of the plurality of time intervals;
- determine an average current level required to charge the offset capacitor to the increased offset voltage; and
- control the switcher circuit to adjust the charging current to the average current level in the second one of the plurality of time intervals.

14. The ETIC of claim 12, wherein the control circuit is further configured to:
- determine the initial ET voltage corresponding to the increased offset voltage in the second one of the plurality of time intervals;
- determine that the supply voltage is set to increase in the second one of the plurality of time intervals when the determined initial ET voltage changes from being lower than a threshold voltage to being higher than or equal to the threshold voltage; and
- determine that the supply voltage is set to decrease in the second one of the plurality of time intervals when the determined initial ET voltage changes from being higher than or equal to the threshold voltage to being lower than the threshold voltage.

15. The ETIC of claim 14, wherein the control circuit is further configured to control the supply voltage circuit to provide the low supply voltage to the voltage amplifier in the second one of the plurality of time intervals in response to determining that the supply voltage is set to decrease in the second one of the plurality of time intervals.

16. The ETIC of claim 14, wherein the control circuit is further configured to control the supply voltage circuit to provide the high supply voltage to the voltage amplifier in the first one of the plurality of time intervals in response to determining that the supply voltage is set to increase in the second one of the plurality of time intervals.

17. The ETIC of claim 9, wherein the control circuit is further configured to:
- determine that the offset voltage is set to decrease in the second one of the plurality of time intervals;
- determine an average current level required to discharge the offset capacitor to the decreased offset voltage; and control the switcher circuit to adjust the charging current to the average current level in the first one of the plurality of time intervals.

18. The ETIC of claim 17, wherein the control circuit is further configured to:
  determine the initial ET voltage corresponding to the decreased offset voltage in the second one of the plurality of time intervals;
  determine that the supply voltage is set to increase in the second one of the plurality of time intervals when the determined initial ET voltage changes from being lower than a threshold voltage to being higher than or equal to the threshold voltage; and
  determine that the supply voltage is set to decrease in the second one of the plurality of time intervals when the determined initial ET voltage changes from being higher than or equal to the threshold voltage to being lower than the threshold voltage.

19. The ETIC of claim 18, wherein the control circuit is further configured to control the supply voltage circuit to provide the high supply voltage to the voltage amplifier in the first one of the plurality of time intervals in response to determining that the supply voltage is set to increase in the second one of the plurality of time intervals.

20. The ETIC of claim 18, wherein the control circuit is further configured to control the supply voltage circuit to provide the low supply voltage to the voltage amplifier in the second one of the plurality of time intervals in response to determining that the supply voltage is set to decrease in the second one of the plurality of time intervals.

* * * * *